(12) United States Patent
Kronholz et al.

(10) Patent No.: US 8,673,668 B2
(45) Date of Patent: Mar. 18, 2014

(54) TEST STRUCTURE FOR CONTROLLING THE INCORPORATION OF SEMICONDUCTOR ALLOYS IN TRANSISTORS COMPRISING HIGH-K METAL GATE ELECTRODE STRUCTURES

(75) Inventors: Stephan Kronholz, Dresden (DE); Maciej Wiatr, Dresden (DE); Rainer Giedigkeit, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 495 days.

(21) Appl. No.: 12/965,341

(22) Filed: Dec. 10, 2010

(65) Prior Publication Data
US 2012/0001174 A1  Jan. 5, 2012

(30) Foreign Application Priority Data

Jun. 30, 2010 (DE) .......................... 10 2010 030 766

(51) Int. Cl.
*H01L 21/00*  (2006.01)
(52) U.S. Cl.
USPC .. 438/48; 438/18; 257/E23.179; 257/E21.521
(58) Field of Classification Search
USPC ................ 438/18, 48; 257/E23.179, E21.521
See application file for complete search history.

(56) References Cited

U.S. PATENT DOCUMENTS

| 6,368,972 | B1 | 4/2002 | Maury et al. | 438/692 |
|---|---|---|---|---|
| 7,713,763 | B2 * | 5/2010 | Mowry et al. | 438/14 |
| 2003/0230790 | A1 | 12/2003 | Wu | 257/620 |
| 2005/0128490 | A1 * | 6/2005 | Stanke et al. | 356/601 |
| 2008/0012073 | A1 * | 1/2008 | Frohberg et al. | 257/347 |
| 2009/0101976 | A1 * | 4/2009 | Madhavan et al. | 257/347 |

OTHER PUBLICATIONS

Translation of Official Communication from German Patent Office for German Patent Application No. 10 2010 030 766.1 dated Mar. 4, 2011.

* cited by examiner

*Primary Examiner* — Colleen A Matthews
*Assistant Examiner* — Colleen E Snow
(74) *Attorney, Agent, or Firm* — Amerson Law Firm, PLLC

(57) ABSTRACT

When forming critical threshold adjusting semiconductor alloys and/or strain-inducing embedded semiconductor materials in sophisticated semiconductor devices, at least the corresponding etch processes may be monitored efficiently on the basis of mechanically gathered profile measurement data by providing an appropriately designed test structure. Consequently, sophisticated process sequences performed on bulk semiconductor devices may be efficiently monitored and/or controlled by means of the mechanically obtained profile measurement data without significant delay. For example, superior uniformity upon providing a threshold adjusting semiconductor alloy in sophisticated high-k metal gate electrode structures for non-SOI devices may be achieved.

17 Claims, 7 Drawing Sheets

TEST STRUCTURE FOR CONTROLLING THE INCORPORATION OF SEMICONDUCTOR ALLOYS IN TRANSISTORS COMPRISING HIGH-K METAL GATE ELECTRODE STRUCTURES

BACKGROUND OF THE INVENTION

1. Field of the Invention

Generally, the present disclosure relates to the fabrication of integrated circuits, and, more particularly, to field effect transistors, such as P-channel transistors, comprising an embedded strain-inducing semiconductor alloy and a high-k metal gate electrode formed in an early manufacturing stage.

2. Description of the Related Art

The fabrication of complex integrated circuits requires the provision of a large number of transistor elements, which represent the dominant circuit element in complex integrated circuits. For example, several hundred millions of transistors may be provided in presently available complex integrated circuits. Generally, a plurality of process technologies are currently practiced, wherein, for complex circuits, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, millions of transistors, i.e., N-channel transistors and P-channel transistors, are formed on a substrate including a crystalline semiconductor layer. A MOS transistor or generally a field effect transistor, irrespective of whether an N-channel transistor or a P-channel transistor is considered, comprises so-called PN junctions that are formed by an interface of highly doped drain and source regions and an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions to provide low sheet and contact resistivity in combination with desired channel controllability.

Upon continuously reducing the channel length of field effect transistors, generally, an increased degree of capacitive coupling is required in order to maintain controllability of the channel region, which may typically require an adaptation of a thickness and/or material composition of the gate dielectric material. For example, for a gate length of approximately 80 nm, a gate dielectric material based on silicon dioxide with a thickness of less than 2 nm may be required in high speed transistor elements, which may, however, result in increased leakage currents caused by hot carrier injection and direct tunneling of charge carriers through the extremely thin gate dielectric material. Since a further reduction in thickness of silicon dioxide-based gate dielectric materials may become increasingly incompatible with thermal power requirements of sophisticated integrated circuits, other alternatives have been developed in increasing the charge carrier mobility in the channel region, thereby also enhancing overall performance of field effect transistors. One promising approach in this respect is the generation of a certain type of strain in the channel region, since the charge carrier mobility in silicon strongly depends on the strain conditions of the crystalline material. For example, for a standard crystallographic configuration of the silicon-based channel region, a compressive strain component in a P-channel transistor may result in a superior mobility of holes, thereby increasing switching speed and drive current of P-channel transistors. The desired compressive strain component may be obtained according to well-established approaches by incorporating a strain-inducing semiconductor material, for instance in the form of a silicon/germanium mixture or alloy, in the drain and source areas within the active region of the P-channel transistor. For example, after forming the gate electrode structure, corresponding cavities may be formed laterally adjacent to the gate electrode structure in the active region and may be refilled with the silicon/germanium alloy which, when grown on the silicon material, may have an internal strained state, which in turn may induce a corresponding compressive strain component in the adjacent channel region. Consequently, a plurality of process strategies have been developed in the past in order to incorporate a highly strained silicon/germanium material in the drain and source areas of P-channel transistors, wherein the efficiency of the strain mechanism critically depends on the material composition of the silicon/germanium mixture, i.e., on the germanium concentration, and the amount of the mixture and its offset from the channel region. These aspects, in turn, are determined by the depth and shape of the cavities formed in the active region.

During the continuous reduction of the critical dimensions of transistors, also an appropriate adaptation of the material composition of the gate dielectric material has been proposed such that, for a physically appropriate thickness of a gate dielectric material, i.e., for reducing the gate leakage currents, nevertheless, a desired high capacitive coupling may be achieved. Thus, material systems have been proposed which have a significantly higher dielectric constant compared to the conventionally used silicon dioxide-based materials, silicon oxynitride materials and the like. For example, dielectric materials including hafnium, zirconium, aluminum and the like may have a significantly higher dielectric constant and are, therefore, referred to as high-k dielectric materials, which are to be understood as materials having a dielectric constant of 10.0 or higher when measured in accordance with typical measurement techniques. As is well known, the electronic characteristics of the transistor elements also strongly depend on the work function of the gate electrode material which influences the band structure of the semiconductor material in the channel region separated from the gate electrode material by the gate dielectric material. In well-established polysilicon/silicon dioxide-based gate electrode structures, the corresponding threshold voltage, strongly influenced by the gate dielectric material and the adjacent electrode material, is adjusted by appropriately doping the polysilicon material in order to adjust the work function of the polysilicon material at the interface between the gate dielectric material and the electrode material. Similarly, in gate electrode structures, including a high-k gate dielectric material, the work function has to be appropriately adjusted for N-channel transistors and P-channel transistors, respectively, which may require appropriately selected work function adjusting metal species, such as lanthanum for N-channel transistors and and aluminum for P-channel transistors. For this reason, corresponding metal-containing conductive materials may be positioned close to the high-k gate dielectric material in order to form an appropriately designed interface that results in the target work function of the gate electrode structure. In many conventional approaches, the work function adjustment may be performed at a very late manufacturing stage, i.e., after any high temperature processes, which may require the replacement of a placeholder material of the gate electrode structures, such as polysilicon, and the incorporation of appropriate work function adjusting species in combination with an electrode metal, such as aluminum and the like. In this case, however, very complex patterning and deposition process sequences may be required on the basis of gate electrode structures having critical dimensions of 50 nm and significantly less, which may result in severe variations of the resulting transistor characteristics.

Therefore, other process strategies have been proposed in which the work function adjusting materials may be applied in an early manufacturing stage, i.e., upon forming the gate electrode structures, wherein the corresponding metal species may be thermally stabilized and encapsulated in order to obtain the desired work function and thus threshold voltage of the transistors without being unduly influenced by the further processing. For this purpose, it turns out that, for P-channel transistors, an appropriate adaptation of the valence band energy of the channel semiconductor material may be required in order to appropriately set the work function of the P-channel transistors. For this reason, frequently, a so-called threshold adjusting semiconductor material, for instance in the form of a silicon/germanium mixture, may be formed on the active regions of the P-channel transistors prior to forming the gate electrode structures, thereby obtaining the desired offset in the band gap of the channel semiconductor material.

The threshold adjusting semiconductor alloy, such as the silicon/germanium material, is typically provided within the active region of P-channel transistors on the basis of a selective epitaxial growth process, wherein, frequently, the active region may be recessed prior to actually depositing the semiconductor alloy. Consequently, upon forming sophisticated semiconductor devices comprising strain-inducing mechanisms, threshold adjusting semiconductor alloys and the like, complex etch processes may have to be performed in order to form recesses or cavities for accommodating the epitaxially grown semiconductor alloy, wherein the overall transistor characteristics may critically depend on the uniformity of the involved etch processes, as will be described in more detail with reference to FIGS. 1a-1d.

FIG. 1a schematically illustrates a cross-sectional view of a semiconductor device 100 in which a strain-inducing mechanism is to be implemented in at least one type of transistor on the basis of a strain-inducing embedded semiconductor material. In the manufacturing stage shown in FIG. 1a, the semiconductor device 100 comprises a substrate 101 above which is formed a semiconductor layer 103, such as a silicon layer. The semiconductor layer 103 and the substrate 101 may form a bulk configuration when the semiconductor layer 103 is a part of a crystalline material of the substrate 101. In other cases, as indicated by the dashed lines, a buried insulating layer 102, such as a silicon dioxide layer and the like, is frequently formed below the semiconductor layer 103, thereby providing an SOI (silicon-in-insulator) configuration. It should be appreciated that bulk architectures and SOI architectures are both used in many fields of semiconductor products in order to implement very sophisticated circuit elements on the basis of critical dimensions of 50 nm and less.

The semiconductor layer 103 comprises an isolation structure 103C, for instance in the form of a shallow trench isolation and the like, thereby laterally delineating a plurality of semiconductor regions or active regions, wherein, for convenience, a single active region 103A is illustrated in FIG. 1a. The active region 103A represents a portion of the layer 103 in which an appropriate basic doping is provided in order to form the PN junctions of at least one transistor 120, which in the present example represents a P-channel transistor. In the manufacturing stage shown, a gate electrode structure 110 is formed on the active region 103A and comprises a gate dielectric material 113 which separates an electrode material 112 from a channel region 123, which represents a portion of the active region 103A. The gate electrode structure 110 may further comprise a dielectric cap layer 111, such as a silicon nitride material, a silicon dioxide material and the like, which may cover the electrode material 112, while a sidewall spacer structure 114, for instance comprised of silicon nitride, possibly in combination with an appropriate liner material (not shown), may protect the materials 112 and 113 during the further processing. It should be appreciated that the gate electrode structure 110 may have incorporated therein any sophisticated material systems, such as high-k dielectric materials in the gate insulation layer 113, as will also be described later on in more detail, possibly in combination with metal-containing electrode materials, while in other cases the electrode material 112 is provided in the form of a semiconductor material, such as amorphous or polycrystalline silicon and the like. Furthermore, in some approaches, any other sophisticated material or material systems may be provided in a very later manufacturing stage by replacing at least a portion of the material 112 according to well-established replacement gate approaches. It should further be appreciated that a length of the gate electrode structure 110, i.e., in FIG. 1a, the horizontal extension of the electrode material 112, may be 50 nm and less in sophisticated semiconductor devices.

The semiconductor device 100 as illustrated in FIG. 1a may be formed on the basis of any appropriate process strategy. For example, the isolation structure 103C is formed on the basis of sophisticated lithography, etch, deposition and planarization techniques, thereby laterally delineating the active region 103A so as to define the lateral size of the active region 103A in accordance with the design rules. Next, the gate electrode structure 110 may be formed on the basis of sophisticated deposition and patterning strategies, which may also include appropriate process strategies for forming the sidewall spacer structure 114, which may substantially define the lateral offset of cavities 104 to be provided within the active region 103A.

As previously discussed, performance of transistors such as the transistor 120 may be significantly enhanced by creating a specific strain in the channel region 123, which may be accomplished by incorporating a semiconductor alloy having a different natural lattice constant compared to the semiconductor base material of the active region 103A. To this end, the cavities 104 may be formed on the basis of any appropriate etch strategy and subsequently well-established epitaxial growth techniques may be applied in order to grow the semiconductor alloy on the base material of the active region 103A, wherein the mismatch in natural lattice constants between the semiconductor alloy and the base material may thus provide a certain strain component, which may thus be efficiently transferred into the channel region 123, thereby also creating a corresponding "deformation," which may thus increase charge carrier mobility. The efficiency of the strain-inducing effect may significantly depend on the material composition, for instance on the concentration of germanium in a silicon/germanium mixture, which, however, may be restricted by available deposition recipes, wherein typically a germanium concentration of up to 30 or 35 atomic percent may be practical in view of avoiding undue lattice defects. Other important factors that determine the finally achieved strain in the channel region 123 are the lateral offset of the material from the channel region 123 and the amount of material. These factors may significantly depend on the size and shape of the cavities 104. Upon further reducing dimensions of the transistor 120, superior control of the etch process may be required since any process non-uniformities may over-proportionally affect the final transistor characteristics. Therefore, in sophisticated process sequences, an efficient control mechanism is implemented, in which the result of the etch process for forming the cavities 104 is monitored, for instance, by measuring the degree of material removal and comparing the measured values with a target depth of the cavities 104, which may be in the range of 50-80 nm, depending on the overall process and device requirements.

FIG. 1b schematically illustrates the semiconductor device 100 in an early manufacturing stage in which sophisticated etch processes may also have to be applied in order to form a semiconductor alloy, such as a silicon/germanium alloy, in a corresponding recess. As illustrated, the device 100 comprises the active region 103A and a further active region 103B, which are delineated by the isolation structure 103C, as previously discussed. The active region 103A is to receive a semiconductor alloy so as to modify the electronic characteristics of a channel region of the transistor to be formed in and above the active region 103A, for instance for appropriately adjusting the threshold voltage in combination with a high-k metal gate electrode structure, as is also discussed above. To this end, a recess 105 may be selectively formed in the active region 103A, which may be accomplished by applying sophisticated etch processes, such as wet chemical etch processes on the basis of HCl and the like. Thereafter, the semiconductor alloy may be selectively grown in the recess 105 based on well-established selective epitaxial growth techniques, wherein the active region 103B may be masked by any appropriate dielectric material. It should be appreciated that the resulting threshold voltage may significantly depend on the material composition and the thickness of the semiconductor alloy and thus on the depth of the recess 105. For example, typically, a depth of approximately 10 nm may be required so as to obtain the desired threshold voltage for a given material composition of the silicon/germanium alloy.

FIG. 1c schematically illustrates the device 100 in a further advanced manufacturing stage. As illustrated, a semiconductor alloy 121, such as a silicon/germanium alloy, is incorporated in the active region 103A so as to provide the desired band gap offset, as discussed above. Furthermore, the gate electrode structures 110 for the transistor 120 and a second transistor 120B may be provided in an early manufacturing stage. The gate electrode structures 110 may comprise the gate dielectric material 113 in the form of a sophisticated gate material system, for instance comprising a high-k dielectric material based on hafnium oxide, zirconium oxide, nitrogen-enriched hafnium oxide and the like. Furthermore, a metal-containing electrode material 115 may be formed on the gate dielectric material 113, wherein, in particular, the material 115 in combination with the semiconductor alloy 121 may determine the resulting threshold voltage of the transistor 120. Therefore, even small variations in layer thickness of the material 121 may result in a significant change of the resulting threshold voltage, which may thus result in a significant variability of transistor characteristics when considering a plurality of the transistors 120. Consequently, in addition to providing a high process uniformity in forming the complex gate electrode structures 110, superior process control for forming the semiconductor alloy 121 is also required, wherein an appropriate provision of the recess 105 (FIG. 1b) is an essential aspect and thus requires a thorough control of the results of the etch process.

It should be appreciated, as indicated in FIG. 1c, that, in this manufacturing stage, for instance after providing any sidewall spacer structure, as previously discussed, the cavities 104 may be provided in the active region 103A, as explained with reference to FIG. 1a.

FIG. 1d schematically illustrates a measurement strategy in which the quality of sensitive etch processes during any process modules for providing a semiconductor alloy on the basis of a corresponding recess etch process may be monitored. In the case shown in FIG. 1d, it may be assumed that the process for forming the recess 105 is to be monitored, which may be accomplished by using an ellipsometer and a corresponding ultraviolet radiation 106 in order to determine a change in layer thickness caused by the corresponding etch process. To this end, typically, appropriate test areas may be provided, for instance in the scribe line of the semiconductor wafer, i.e., in the vicinity of the actual die region, which may comprise the active regions, which receive the recess 105. The measurement strategy on the basis of an ellipsometer may be efficiently applied to an SOI architecture in which the buried insulating material 102 may provide an appropriate interface with the semiconductor layer 103 in order to optically respond to the probing radiation 106. Consequently, the radiation 106 may be sensitive to changes in layer thickness of several nanometers in order to assess the quality of the etch process for forming the recess 105. Similarly, measurement processes on the basis of elipsometry may also be applied when assessing any etch processes for forming the cavities 104 (FIG. 1a), thereby enabling an efficient control of any process modules for forming semiconductor alloys for sophisticated transistors.

It turns out, however, that elipsometry may not be efficiently used in the context of bulk devices in which the semiconductor layer 103 may directly connect to a crystalline material of the substrate 101 so that an optically active interface, as is provided in SOI configurations by means of the buried insulating material 102, is not available. Therefore, an optically effective thickness of the crystalline material of the layer 103 and a portion of the substrate 101 may be significantly greater than any change of layer thickness caused by the etch processes to be monitored, so that the corresponding measurement sensitivity is insufficient for appropriately evaluating the process sequences of interest.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques and semiconductor devices in which an appropriate test structure may be provided that may be accessed by a profilometer, i.e., by measurement equipment comprising a mechanical stylus, which may scan a surface in order to provide profile measurement data, which may indicate changes in surface topography within several nanometers. Any such mechanically operating surface scanning measurement instruments are well established in the art and comprise a mechanical probe or stylus, which may be scanned across a surface, wherein the displacement of the mechanical probe may be recorded and provided as profile measurement data. To this end, the test structure of the structure of the present disclosure may be appropriately configured in order to allow mechanical access, while at the same time providing sufficient similarity between the test structure and the actual device features. In some illustrative embodiments disclosed herein, the test structure may comprise at least one row of appropriately dimensioned semiconductor regions, which may be separated by an isolation structure and some of which may be subjected to a process sequence for forming a threshold adjusting semiconductor alloy and/or a strain-inducing semiconductor alloy. Consequently, at any desired stage of the manufacturing process, corresponding profile measurement data may be obtained from the test structure and may be used for monitoring and re-adjusting or controlling the etch process, at least for one subsequent semiconductor substrate to be processed, so as to also receive a threshold adjusting semiconductor alloy and/or a strain-inducing semiconductor material.

One illustrative method disclosed herein relates to monitoring a process flow for forming a semiconductor device. The method comprises providing a plurality of test semiconductor regions regularly positioned in a semiconductor layer of a first substrate, wherein the plurality of semiconductor regions are laterally separated by isolation structures. Moreover, the semiconductor layer comprises a plurality of active regions having lateral dimensions for forming therein and thereabove transistors with critical dimensions of 50 nm or less. The method further comprises forming a recess in some of the plurality of test semiconductor regions and some of the plurality of active regions by performing an etch process. Furthermore, the method comprises generating profile measurement data by scanning the plurality of test semiconductor regions by means of a profilometer. Additionally, the method comprises using the profile measurement data for evaluating the etch process.

One illustrative test structure for forming a semiconductor device disclosed herein comprises a semiconductor layer formed above a substrate. The test structure further comprises an isolation structure formed in the semiconductor layer and laterally delineating in a row of test semiconductor regions each of the test semiconductor regions that are regularly positioned in the semiconductor layer with a lateral pitch that is less than a minimum lateral dimension of each semiconductor region of the row of test semiconductor regions. The row of test semiconductor regions comprises in an alternating manner a P-type well doping and an N-type well doping, respectively, wherein the minimum lateral dimension and the lateral pitch are selected so as to enable access by a profilometer probe for obtaining profile measurement data from the row of test semiconductor regions.

One illustrative semiconductor device disclosed herein comprises a semiconductor layer formed on a crystalline semiconductor material of a substrate and a transistor comprising a high-k metal gate electrode structure that is formed on an active region. The active region is formed in the semiconductor layer and comprises a threshold adjusting semiconductor alloy and a semiconductor base material. The semiconductor device further comprises a test structure comprising a plurality of test semiconductor regions formed in the semiconductor layer and regularly positioned in a row so as to enable access by a profilometer probe.

BRIEF DESCRIPTION OF THE DRAWINGS

The disclosure may be understood by reference to the following description taken in conjunction with the accompanying drawings, in which like reference numerals identify like elements, and in which:

FIGS. 1$b$-1$c$ schematically illustrate cross-sectional views of a semiconductor device in an early manufacturing stage in forming a sophisticated high-k metal gate electrode structure on the basis of the threshold adjusting semiconductor material formed in a recess of an active region, according to conventional strategies;

FIG. 1$d$ schematically illustrates a cross-sectional view of the semiconductor device during a measurement procedure based on elipsometry for evaluating the quality of a sensitive etch process for providing a recess in order to form a semiconductor alloy therein, according to conventional strategies;

FIGS. 2$b$-2$e$ schematically illustrate cross-sectional views of the semiconductor device during various manufacturing stages in forming a recess and refilling the same while also providing appropriate profile measurement data on the basis of a profilometer measurement, according to illustrative embodiments;

FIG. 2$f$ schematically illustrates a top view of the test structure in a further advanced manufacturing stage in which gate electrode structures may be provided on active regions of circuit elements, according to illustrative embodiments; and FIGS. 2$g$-2$h$ schematically illustrate cross-sectional views of the semiconductor device in further advanced manufacturing stages in which cavities or recesses may be formed in an active region in order to provide a strain-inducing semiconductor alloy, while the quality of the etch process may be evaluated, according to still further illustrative embodiments.

Figure 1A:
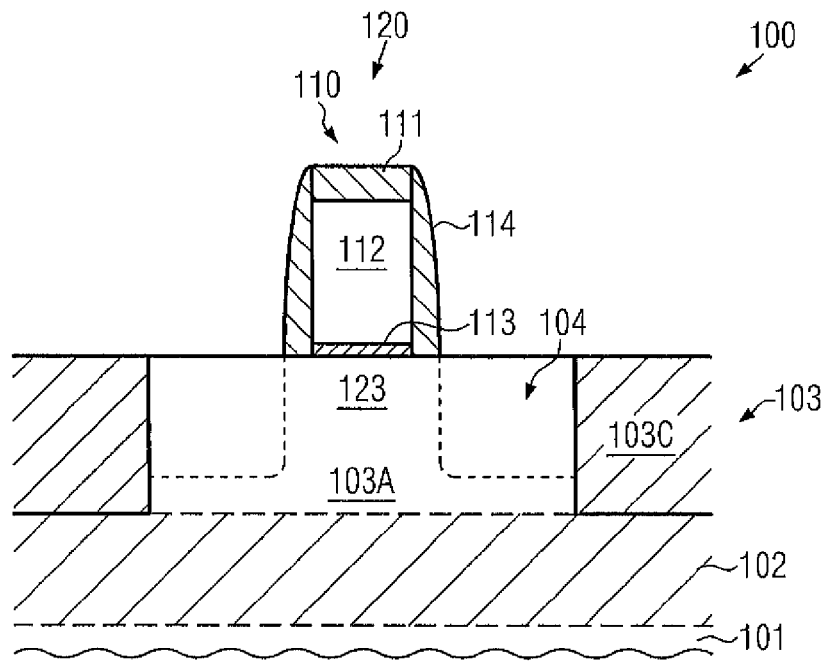
FIG. 1$a$ schematically illustrates a cross-sectional view of a sophisticated semiconductor device comprising a transistor receiving an embedded strain-inducing semiconductor alloy on the basis of a complex etch process.
Figure 1B:
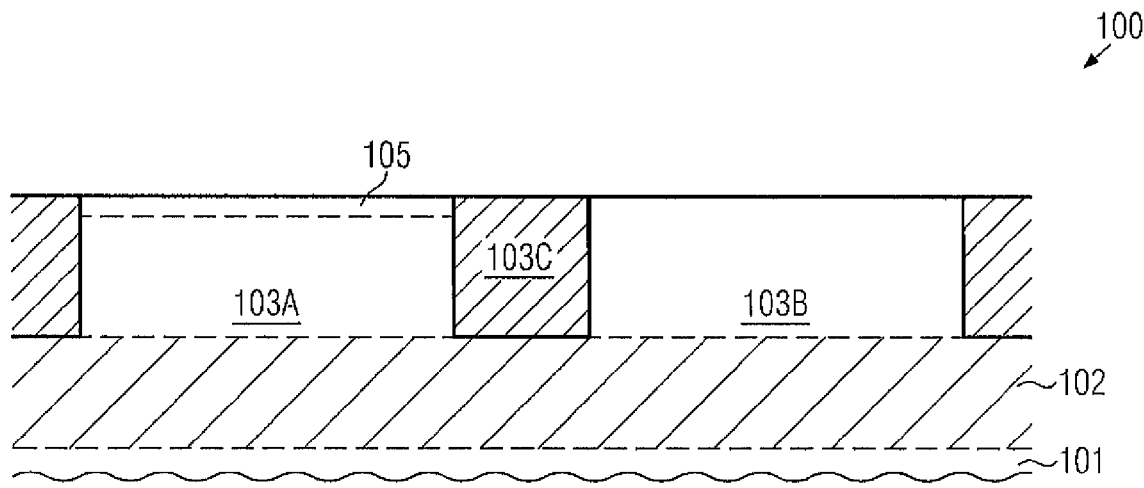
Figure 1C:
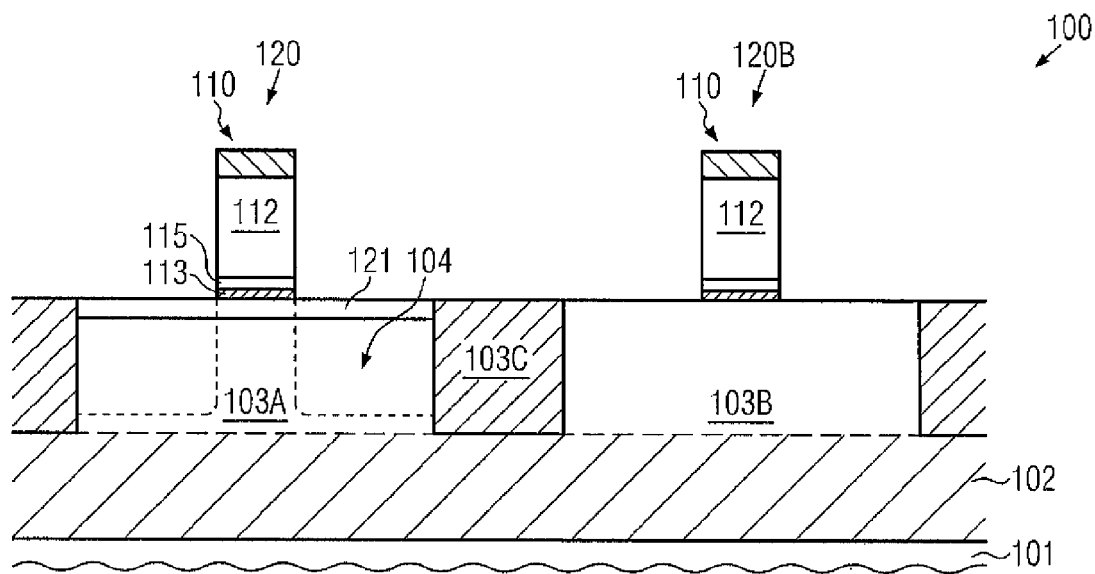
Figure 1D:
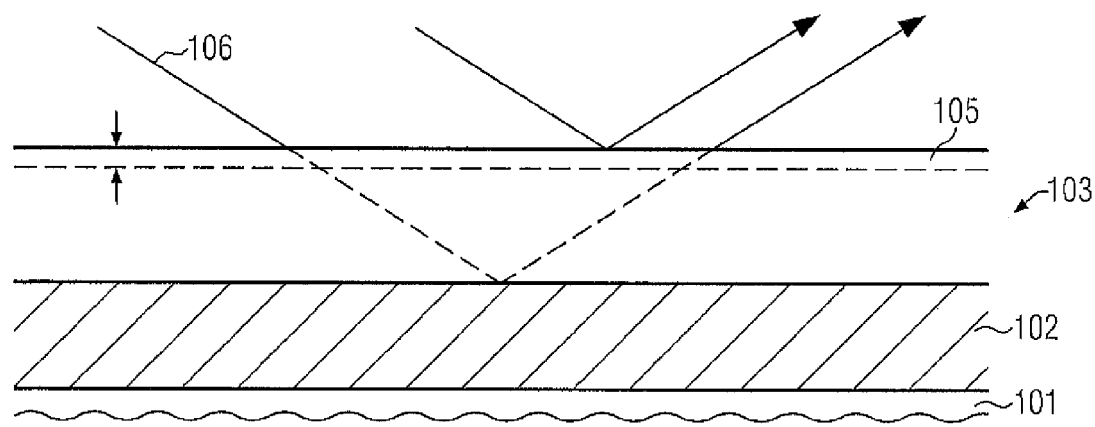

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and manufacturing techniques in which sensitive etch processes may be efficiently evaluated and/or controlled on the basis of efficient measurement techniques using a profilometer, wherein an appropriately configured test structure may allow mechanical access and the generation of appropriate profile measurement data. Consequently, on the basis of the profilometer measurements, the measurement data may be obtained with reduced delay in the form of "process line internal" measurement data, thereby allowing an appropriate coverage of the product substrates compared to very sophisticated and time-consuming measurement procedures, for instance based on AFM (atomic force microscopy) measurement strategies. By using a mechanical measurement strategy, the measurement data may be generated without requiring specific substrate characteristics, such as a buried insulating material and the like, as is typically the case in conventional optical measurement techniques. Therefore, the principles disclosed herein may be advantageously applied to bulk devices and SOI devices for forming sophisticated transistor elements on the basis of high-k metal gate electrode structures and/or complex strain-inducing mechanisms based on embedded semiconductor alloys.

With reference to FIGS. 2a-2h, further illustrative embodiments will now be described in more detail, wherein reference may also be made to FIGS. 1a-1d, if appropriate.

Figure 2A:
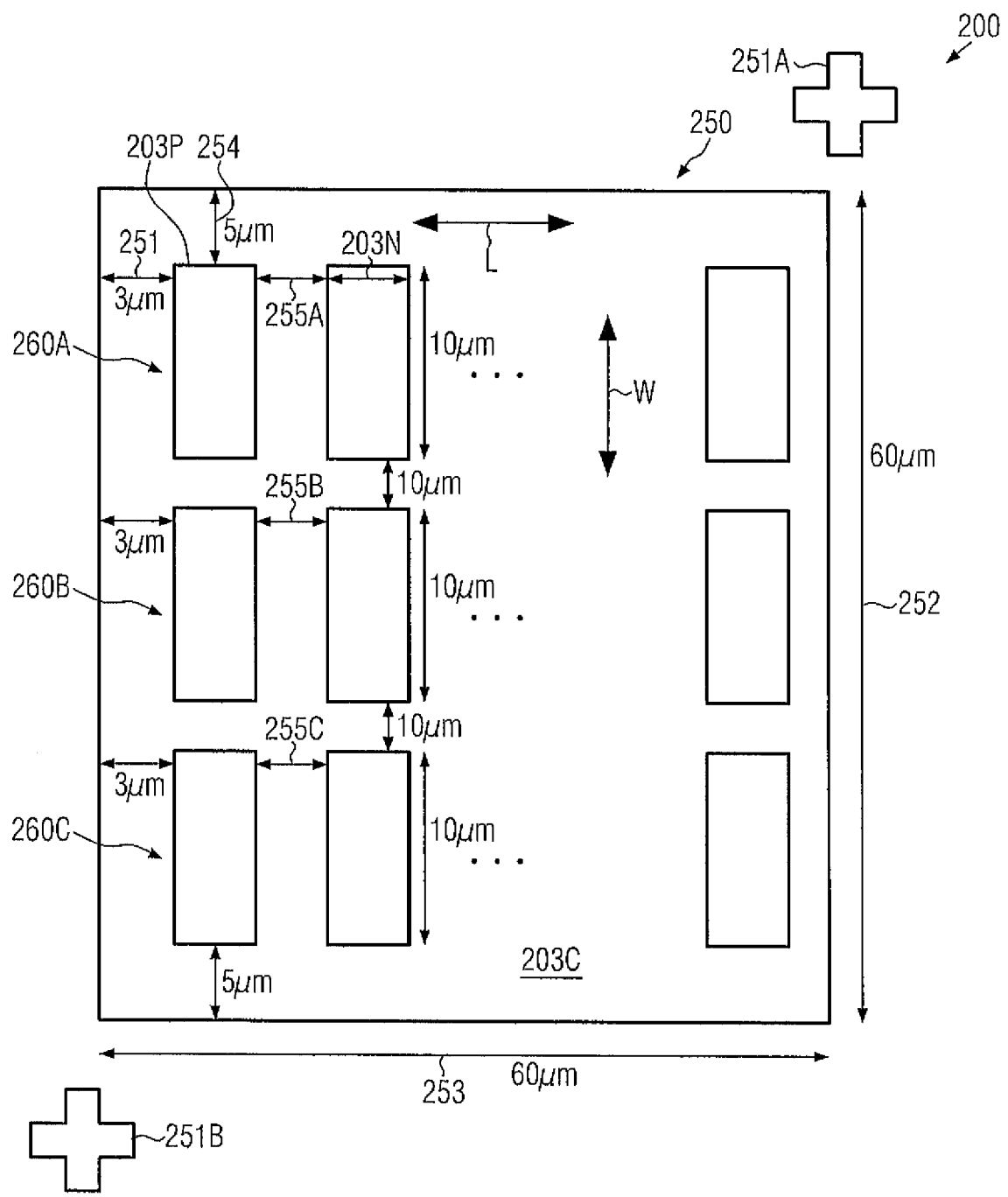
FIG. 2$a$ schematically illustrates a top view of a semiconductor device comprising a test structure that is appropriately configured to enable mechanical access by a profilometer probe in order to qualitatively monitor sensitive etch processes to be used for forming recesses that have to be refilled by a semiconductor alloy, according to illustrative embodiments.

FIG. 2a schematically illustrates a top view of a semiconductor device 200 in an early manufacturing stage. The semiconductor device 200 may comprise a test structure 250, which is to be understood as a device area within the semiconductor device 200 in which measurement data may be obtained, which are correlated to the status of any circuit features formed within the semiconductor device 200 in any appropriately positioned device areas outside of the test structure 250. In the manufacturing stage shown, a plurality of semiconductor regions, indicated by 203P, 203N, may be provided within a semiconductor layer (not shown), wherein each of the test semiconductor regions 203P, 203N may be laterally embedded and thus laterally delineated by an isolation structure 203C, such as a shallow trench isolation and the like. In some embodiments, all of the semiconductor regions 203P, 203N are arranged in a row, for instance in a row as indicated by 260A, so that the regions 203P, 203N are regularly positioned based on a pitch 255A of neighboring regions, which may be less than 1 μm. In the embodiment shown, the pitch 255A between two neighboring test regions 203P, 203N may be 0.1 μm, wherein it should be appreciated that these values may represent target values and the actual values may vary in accordance with certain process variations. Moreover, the semiconductor test regions 203P, 203N may have a physically rectangular shape according to the top view of FIG. 2a with lateral dimensions which may allow an appropriate mechanical access by a mechanical probe and the gathering of statistically relevant profile measurement data. For example, in a length direction L, the lateral dimension of the regions 203P, 203N may be approximately 5 μm and less, such as approximately 3 μm. In a width direction W, the corresponding lateral dimension of the regions 203P, 203N may be approximately 15 μm and less, for example 10 μm. In the embodiment shown, a plurality of the regions 203P, 203N may be provided within the test structure 250, wherein a length of the row 260A, indicated as 253, may be approximately 100 μm and less, for instance approximately 60 μm. Furthermore, in the embodiment shown, two or more rows of regularly arranged test semiconductor regions may be provided, for instance as illustrated by row 260B and a further row 260C, wherein the corresponding lateral dimensions of the regions 203P, 203N may be the same or may differ in the individual rows 260A, 260B, 260C. For example, in the row 260B, the same lateral dimensions may be used as in the row 260A, wherein, however, a pitch 255B may differ from the pitch 255A. In the example shown, the pitch 255B may be selected to be approximately 0.3 μm. In the row 260C, the semiconductor regions 203P, 203N may have a length of 1 μm and a width of approximately 10 μm, while a pitch 255C may be selected to be approximately 0.5 μm. It should be appreciated, however, that other dimensions may be selected, as long as at least one test region 203P and one test region 203N may be provided in each of the rows 260A, 260B, 260C. Furthermore, in each row, the test semiconductor regions 203P, 203N may have alternatingly inverse well dopings, which may correspond to the doping profile of active regions of transistors provided in other device areas of the semiconductor device 200, as will be described later on in more detail. For example, the semiconductor region 203P may represent a semiconductor region having therein a dopant profile that may correspond to the dopant profile of an active region for a P-channel transistor. Similarly, the test semiconductor region 203N may have provided therein an appropriate well doping as may also be provided in active regions corresponding to N-channel transistors. Consequently, in each of the rows 260A, 260B, 260C, the semiconductor regions 203P, 203N may represent a sequence of semiconductor regions having alternatingly an inverse well doping profile. Moreover, as shown in FIG. 2a, the rows 260A, 260B, 260C may form an array of semiconductor regions which may be laterally enclosed by the isolation structure 203C, wherein a first one of the test regions 203P, 203N may have a minimum distance from any other circuit feature of, for instance, 3 μm in the length direction L and of 5 μm in the width direction W.

Consequently, for the above-specified lateral dimensions, an area of approximately 60 μm×60 μm may be provided within the isolation structure 203C so as to appropriately position the test semiconductor regions 203P, 203N. Moreover, the test structure 250 may comprise appropriately dimensioned and configured alignment marks 251A, 251B which may be efficiently detected by an alignment mechanism, as may typically be provided in automatic profilometer tools, as are already available in the field of semiconductor processing.

Figure 2B:
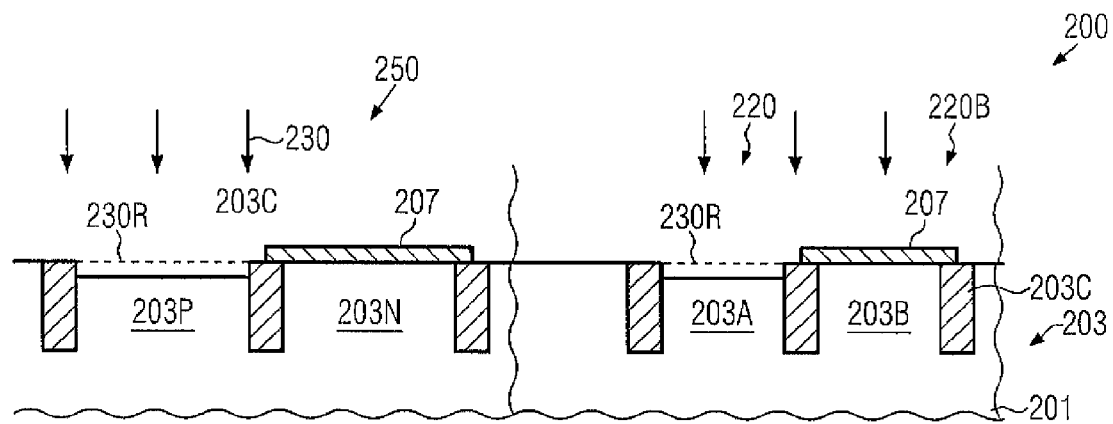

FIG. 2b schematically illustrates a cross-sectional view of the semiconductor device 200 comprising the test structure 250 and active regions 203A, 203B, which may correspond to transistors 220 and 220B. As illustrated, the device 200 may comprise a substrate 201 and a semiconductor layer 203, which, in one illustrative embodiment, may be in direct contact with any crystalline material of the substrate 201, thereby forming a bulk configuration. Consequently, a buried insulating material may not be available below the test structure 250 and the active regions 203A, 203B. Furthermore, as shown, the isolation structure 203C may appropriately delineate the test semiconductor regions 203P, 203N and may also delineate the active regions 203A, 203B in accordance with the overall design rules. Moreover, in the manufacturing stage shown, the active region 203B of the transistor 220B may be covered by any appropriate mask 207, for instance provided in the form of a dielectric material, such as silicon dioxide, silicon nitride and the like. Similarly, the mask 207 may also efficiently cover the test semiconductor region 203N so as to establish similar conditions within the test structure 250.

The semiconductor device 200 as shown in FIG. 2b may be formed on the basis of the following processes. The isolation structure 203C may be formed by using well-established process strategies, wherein an appropriate lithography mask may be used so as to define the test semiconductor regions 203P, 203N, for instance in the form as discussed above with reference to FIG. 2a. On the basis of an appropriate etch mask, trenches may be etched into the semiconductor layer to a desired depth and the trenches may be refilled with any appropriate dielectric material based on deposition techniques, oxidation techniques and the like. Thereafter, any excess material may be removed in order to provide a substantially planar surface topography. Prior to or after forming the isolation structure 203C, the basic well dopant profile may be established in the active regions 203A, 203B by using any well-established implantation and masking strategy, wherein also the well doping in the regions 203P, 203N in the test structure 250 may be formed. For example, the test region 203P and the active region 203A may be processed on the basis of the same process parameters, thereby receiving similar well doping profiles. Next, the mask 207 may be formed, for instance by oxidation, deposition and the like, and subsequently the mask 207 may be patterned in order to expose the regions 203P, 203A, when the region 203A represents an active region that requires the incorporation of a threshold adjusting semiconductor alloy. Thereafter, an etch process 230 may be performed in order to obtain a recess 230R in the active region 203A and thus also within the test semiconductor region 203P, wherein, as previously discussed, a precise monitoring of the etch process 230 may be required in order to provide superior uniformity of the process 230. For example, the recess 230R may be provided on the basis of wet chemical etch recipes, for instance established within a deposition tool in which subsequently a threshold adjusting semiconductor alloy may be deposited on the basis of a selective epitaxial growth strategy.

Figure 2C:
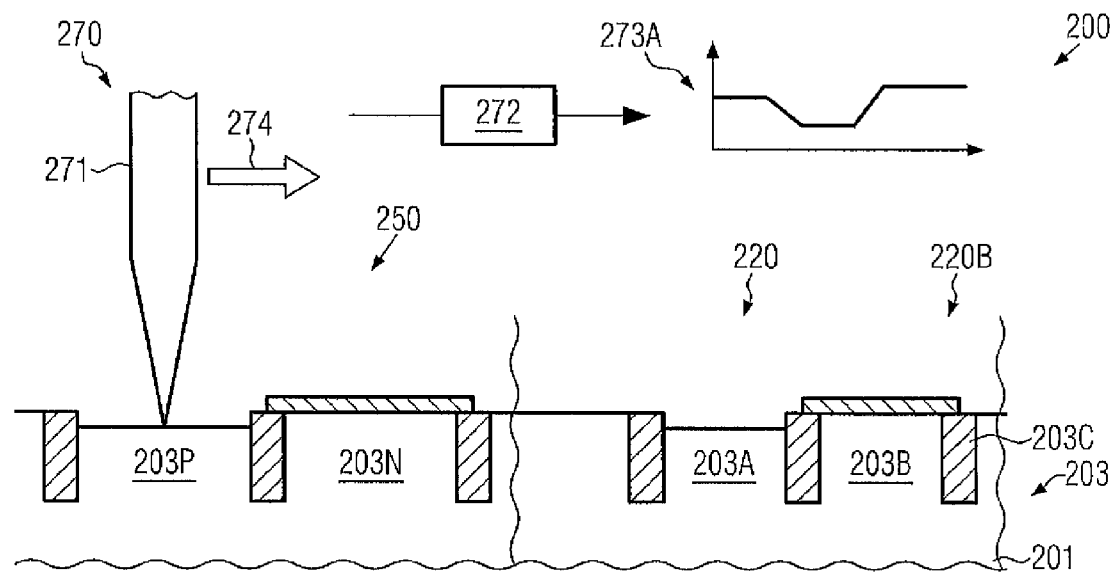

FIG. 2c schematically illustrates the semiconductor device 200 during a measurement procedure 270, in which profile measurement data 273A may be obtained from the test structure 250. It should be appreciated that the measurement procedure 270 may be performed on the basis of the device 200 prior to actually performing the etch process 230 (FIG. 2b) in order to obtain the measurement data 273A for an initial state of the surface topography prior to performing the etch process 230. In the example shown in FIG. 2c, the measurement process 270 may be applied to the device 200, i.e., to the test structure 250, after forming the recess 230R as shown in FIG. 2b. To this end a profilometer, schematically indicated by 271, is used to access the test structure 250 in order to perform a scan motion 274. To this end, any appropriate automatic alignment tool may be used as is typically available in commercially available profilometers by using the alignment marks 251A, 251B (FIG. 2a) and appropriately positioning the substrate 201 with respect to a mechanical probe of the device 271. Thereafter, the scan motion 274 may be initiated, wherein the provision of one or more rows, such as the rows 260A, 260B, 260C, as shown in FIG. 2a, may allow an efficient alignment and a non-critical movement, for instance along the length direction L as shown in FIG. 2a, since the corresponding width of the regions 203P, 203N, i.e., the direction perpendicular to the drawing plane of FIG. 2c, is selected so as to be well within a tolerance range of available profilometer devices. Consequently, by means of an appropriate control unit 272, the profile measurement data 273A may be obtained and may thus represent the surface topography of at least a portion of the test structure 250. The scan motion 274 may be repeated, for instance for each of the rows 260A, 260B, 260C, as shown in FIG. 2a, thereby enabling an assessment of, for instance, a material loss of the isolation structure 203C in device areas having a different "density" with respect to active regions.

Consequently, a plurality of statistically significant profile data sets may be obtained, for instance prior to performing the etch process 230 and after performing the etch process 230, which may allow quantitatively evaluating the etch process 230, for instance by comparing the measurement data and determining an effective etch depth and the degree of uniformity across the test structure 250. To this end, any appropriate and well-established data manipulation techniques may be applied.

Figure 2D:
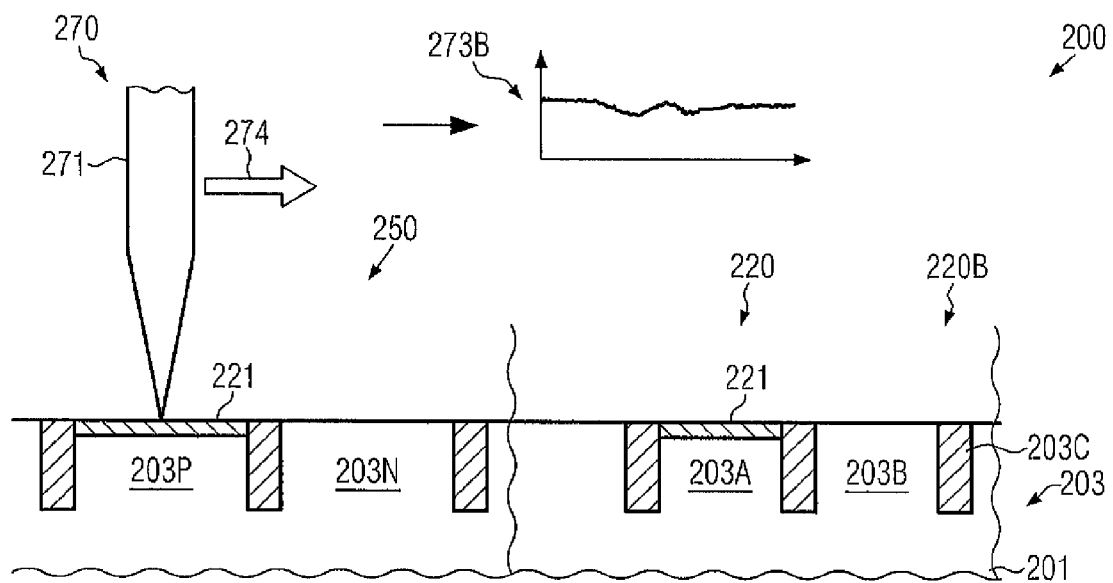

FIG. 2d schematically illustrates the semiconductor device 200 in a further advanced manufacturing stage according to illustrative embodiments in which the measurement process 270 may be applied after forming a threshold adjusting semiconductor material 221 in the active region 203A and thus also within the corresponding test semiconductor regions 203P in the test structure 250. To this end, any desired deposition recipe may be applied, as discussed above, and thereafter the mask 207 (FIGS. 2b, 2c) may be removed on the basis of well-established etch recipes. Consequently, during the measurement process 270, a further set of profile measurement data 273B may be obtained, which may thus be efficiently used to evaluate the etch process 230 (FIG. 2b) and/or the corresponding selective epitaxial growth process for forming the threshold adjusting semiconductor alloy 221.

Figure 2E:
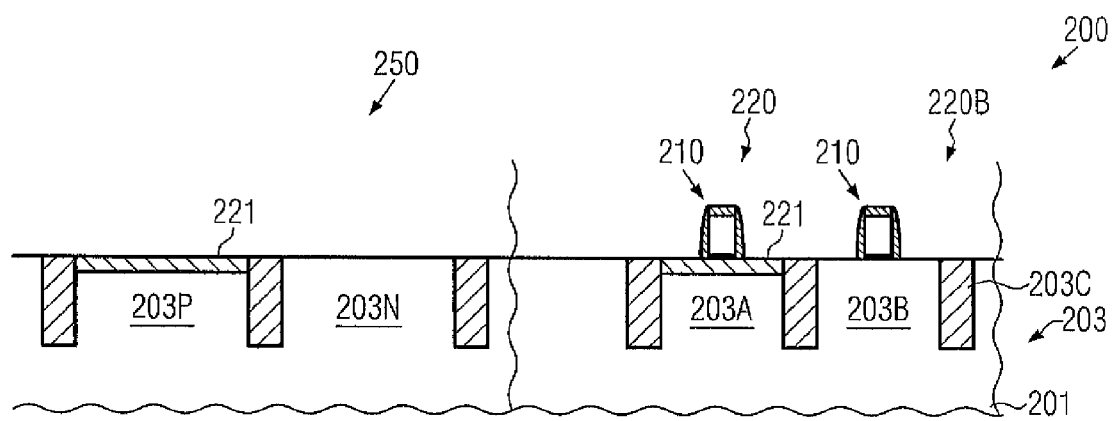

FIG. 2e schematically illustrates the semiconductor device 200 in a further advanced manufacturing stage. As illustrated, gate electrode structures 210 may be formed on the active regions 203A, 203B, for example, as previously discussed with reference to the device 100, the gate electrode structures 210 may represent high-k metal gate electrode structures in which a gate dielectric may be provided so as to include a high-k dielectric material, possibly in combination with a metal-containing electrode material, as is previously explained with reference to FIG. 1c, wherein the previously formed semiconductor alloy 221 may result in a desired overall threshold voltage for the transistor 220. Consequently, based on the previously obtained profile measurement data sets, such as the profile measurement data sets 273A, 273B (FIGS. 2c, 2d), at least one process parameter of the etch process 230 (FIG. 2b) may be controlled so as to provide the desired characteristics of the material 221 for any semiconductor devices to be formed after obtaining the measurement data sets 273A, 273B. It should be appreciated, as discussed above, that the measurement data may also comprise measurement data of the initial surface topography prior to performing the etch process 230 (FIG. 2b).

Figure 2F:
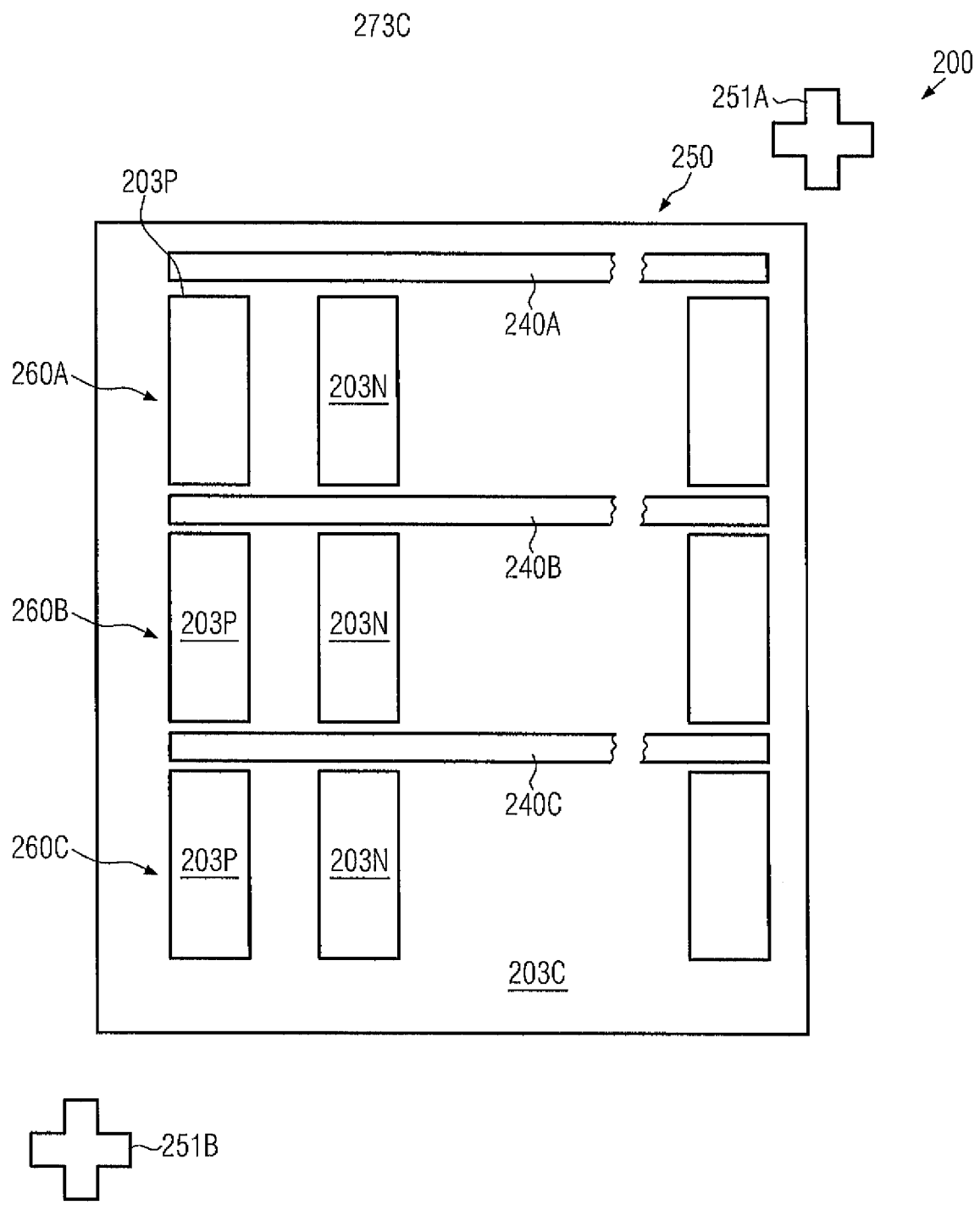

FIG. 2f schematically illustrates a top view of the test structure 250 corresponding to the manufacturing stage as shown in FIG. 2e. Thus, corresponding electrode structures 240A, 240B, 240C may be formed within the structure 250, for instance between the rows 260A, 260B, 260C in accordance with the overall design criteria, thereby providing similar conditions compared to actual device areas, while nevertheless preserving the mechanical accessibility of each of the rows 260A, 260B, 260C for the stylus of a profilometer. For example, as shown, the electrode structures 240A, 240B, 240C may be formed as substantially continuous lines extending along the length direction, wherein a width may be selected so as to comply with the lateral distances between the individual rows 260A, 260B, 260C, which may be selected to be approximately 10 μm in the example shown.

Figure 2G:
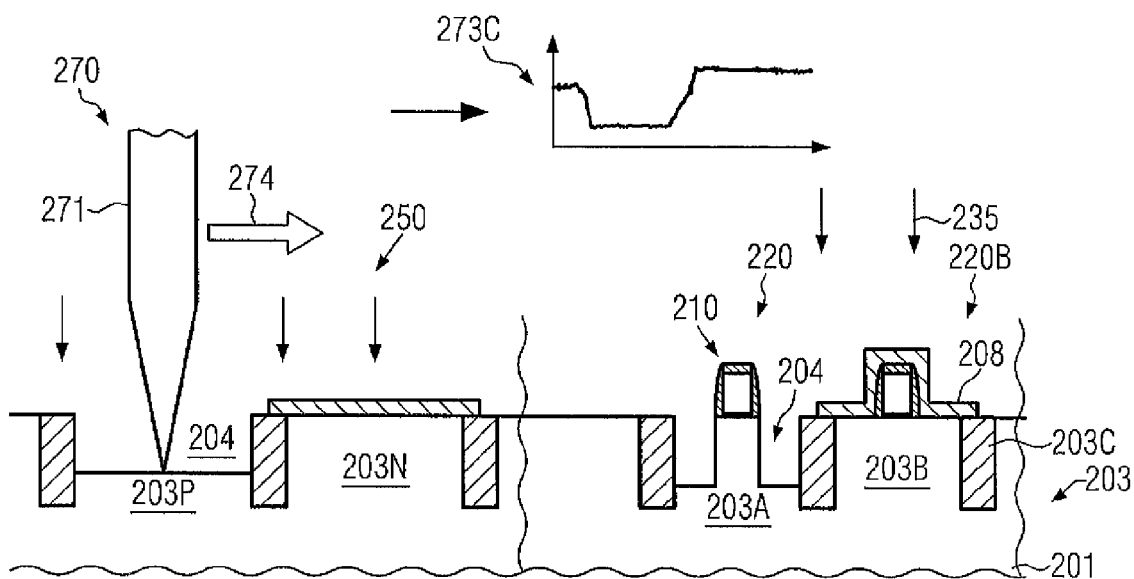

FIG. 2g schematically illustrates the semiconductor device 200 according to further illustrative embodiments in which recesses or cavities 204 may be provided in the active region of the transistor 220 in a manufacturing stage in which the gate electrode structures 210 may already be formed. It should be appreciated that the semiconductor device 200 may have incorporated therein the threshold adjusting semiconductor material 221 (FIG. 2d), when a strain-inducing mechanism may be required in combination with a sophisticated high-k metal gate electrode structure. In other cases, cavities 204 may be provided on the basis of any other appropriate gate electrode configuration, such as a conventional silicon dioxide/polysilicon gate electrode structure, wherein, if required, any sophisticated material systems may be provided in a later manufacturing stage, for instance when applying a replacement gate approach. Thus, in the manufacturing stage shown, the transistor 220B, i.e., the gate electrode structure 210 and the active region 203B, may be covered by a mask 208, such as a silicon nitride mask and the like, while the transistor 220 may be exposed to an etch ambient 235 in order to form the cavities 204. Similarly, the regions 203N may be covered by the mask 208, while the regions 203P may be exposed to the etch ambient 235 in order to form the cavities 204. As previously discussed, a plurality of complex etch strategies may be used during the process 235 in order to provide the cavities 204 with a desired depth. It should be appreciated that the mask 208 may be provided so as to extend into the test region 203P, thereby also providing a masked portion in this test region, which may thus represent similar conditions compared to the active region 203A, a portion of which may be covered by the gate electrode structure 210. It should be appreciated that, prior to the etch process 235, appropriate profile measurement data may be obtained on the basis of the test structure 250, while in other cases the measurement data 273B (FIG. 2d) may be used as measurement data for representing the initial state of the device 200 prior to performing the etch process 235, when a threshold adjusting semiconductor material is to be provided for the transistor 220. After the etch process 235, the measurement procedure 270 may be applied, thereby obtaining a further set of measurement data 273C, which may be efficiently used for quantitatively evaluating the etch process 235.

Figure 2H:
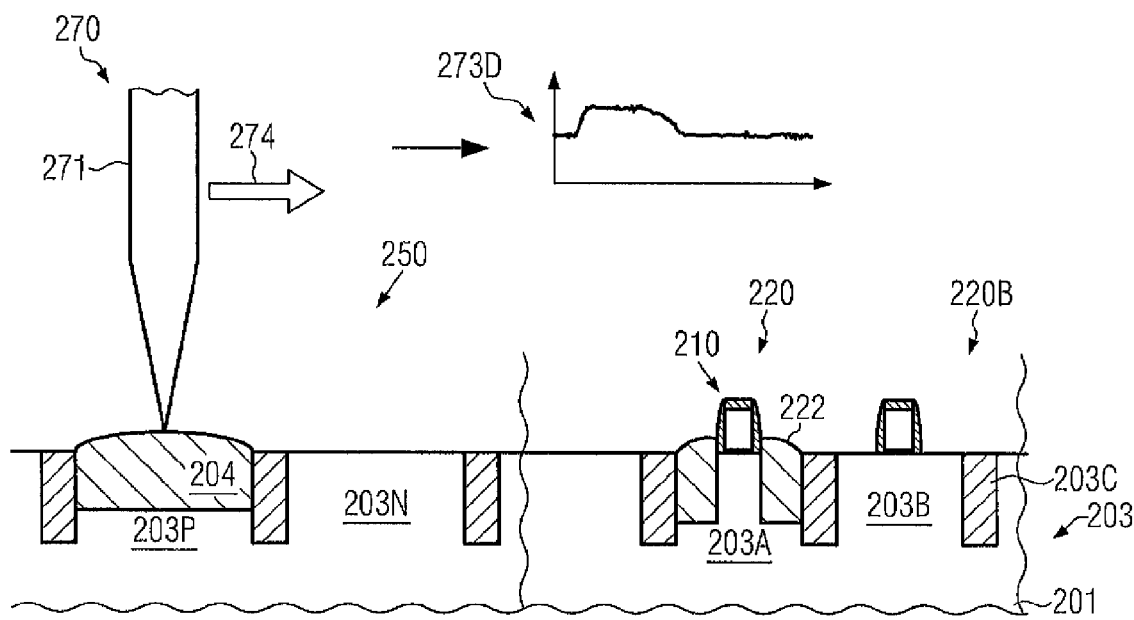

FIG. 2h schematically illustrates the semiconductor device 200 in a further advanced manufacturing stage. As illustrated, a strain-inducing semiconductor material 222 may be formed in the cavities 204, i.e., in the active region 203A and in the test semiconductor regions 203P, which may be accomplished by using any selective epitaxial growth techniques. Furthermore, the device 200 may be subjected to the measurement process 270, thereby obtaining further profile measurement data 273D, which may thus indicate the surface topography after providing the semiconductor alloy 222. Thus, an efficient monitoring and/or controlling of at least the etch process 235 (FIG. 2g) may be accomplished on the basis of the test structure 250, wherein, if desired, also the selective epitaxial growth process may be evaluated on the basis of the profile measurement data 273C and 273D, if desired.

Thereafter, one or more process parameters of the etch process 235 and/or of the subsequent epitaxial growth process may be re-adjusted, if required, upon processing any further semiconductor device 200, thereby providing superior across-substrate uniformity for forming sophisticated transistor elements.

As a result, the present disclosure provides manufacturing techniques and semiconductor devices in which an appropriately designed test structure provides mechanical access by means of a profilometer, which may thus allow a quantitative assessment of at least sensitive etch processes to be performed upon providing semiconductor alloys for adjusting the threshold voltage of complex transistors and/or for implementing a strain-inducing semiconductor material in the active region of sophisticated transistors. Due to the mechanical nature of the measurement process, any type of device configuration, such as bulk configuration, SOI configuration, or any combination thereof, may be efficiently used, thereby avoiding any restrictions as are typically associated with optical measurement techniques for evaluating critical etch processes. Hence, even very subtle changes in etch depth and/or thickness of epitaxially grown semiconductor alloys may be detected.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of monitoring a process flow for forming a semiconductor device, the method comprising:
providing a plurality of test semiconductor regions regularly positioned in a semiconductor layer of a first substrate, said plurality of semiconductor regions being laterally separated by isolation structures, said semiconductor layer further comprising a plurality of active regions having lateral dimensions for forming therein and thereabove transistors with critical dimensions of 50 nm or less;
forming a recess in some of said plurality of test semiconductor regions and some of said plurality of active regions by performing an etch process, wherein said recess is formed prior to forming gate electrode structures above said plurality of active regions;

generating profile measurement data by scanning said plurality of test semiconductor regions by means of a profilometer; and using said profile measurement data for evaluating said etch process.

2. The method of claim 1, further comprising forming a semiconductor alloy in said recesses by performing a selective epitaxial growth process and generating second profile measurement data.

3. The method of claim 2, further comprising using said second profile measurement data for controlling said at least one process parameter.

4. The method of claim 2, wherein said semiconductor alloy comprises silicon and germanium.

5. The method of claim 2, further comprising forming a second recess in said some test semiconductor regions and said some active regions after forming said semiconductor alloy in said recesses and generating third profile measurement data on the basis of said second recesses.

6. The method of claim 5, further comprising forming a second semiconductor alloy in said second recesses and generating fourth profile measurement data after forming said second semiconductor alloy.

7. The method of claim 1, wherein a target depth of said recess is 12 nm or less.

8. The method of claim 1, wherein a target depth of said recesses is 100 nm or less.

9. The method of claim 1, wherein said gate electrodes structures are formed so as to comprise a gate dielectric material containing a high-k dielectric material.

10. The method of claim 1, wherein said recess is formed in a subset of said plurality of active regions, wherein said subset corresponds to active regions of P-channel transistors.

11. A test structure for forming a semiconductor device, the test structure comprising:

a semiconductor layer formed above a substrate;

an isolation structure formed in said semiconductor layer and laterally delineating in a first row of test semiconductor regions each of said test semiconductor regions that are regularly positioned in said semiconductor layer with a lateral pitch that is less than a minimum lateral dimension of each test semiconductor region of said first row of test semiconductor regions, said first row of test semiconductor regions alternatingly comprising a P-type well doping and an N-type well doping, respectively, said minimum lateral dimension and said lateral pitch being selected so as to enable access by a profilometer probe for obtaining profile measurement data from said first row of test semiconductor regions; and a second row of test semiconductor regions, wherein each test semiconductor region of said second row of test semiconductor regions is laterally delineated by said isolation structure and wherein a second pitch of test semiconductor regions in said second row is greater than said lateral pitch.

12. The test structure of claim 11, wherein said lateral pitch of said first row is approximately 1 μm or less.

13. The test structure of claim 12, wherein said test semiconductor regions in said first row have a rectangular shape in a top view, wherein said minimum lateral dimension is approximately 5 μm or less.

14. The test structure of claim 11, wherein an area of said test structure is less than 100 μm$^2$.

15. The test structure of claim 11, wherein said semiconductor layer is in direct contact with a crystalline material of said substrate.

16. A semiconductor device, comprising:

a semiconductor layer formed on a crystalline semiconductor material of a substrate;

a transistor comprising a high-k metal gate electrode structure formed on an active region formed in said semiconductor layer, said active region comprising a threshold adjusting semiconductor alloy and a semiconductor base material; and a test structure comprising a plurality of test semiconductor regions formed in said semiconductor layer regularly positioned in a row so as to enable access by a profilometer probe, wherein said test structure comprises a plurality of rows of regularly positioned test semiconductor regions, wherein a pitch of the regularly positioned test semiconductor regions is different for each row.

17. A method of monitoring a process flow for forming a semiconductor device, the method comprising:

providing a plurality of test semiconductor regions regularly positioned in a semiconductor layer of a first substrate, said plurality of semiconductor regions being laterally separated by isolation structures, said semiconductor layer further comprising a plurality of active regions having lateral dimensions for forming therein and thereabove transistors with critical dimensions of 50 nm or less;

forming a recess in some of said plurality of test semiconductor regions and some of said plurality of active regions by performing an etch process, wherein said recess is formed in a subset of said plurality of active regions, wherein said subset corresponds to active regions of P-channel transistors;

generating profile measurement data by scanning said plurality of test semiconductor regions by means of a profilometer; and using said profile measurement data for evaluating said etch process.

* * * * *